(12) United States Patent
Mantese et al.

(10) Patent No.: US 10,410,814 B2
(45) Date of Patent: Sep. 10, 2019

(54) SYSTEMS AND METHODS FOR SENDING A POWER SIGNAL TO A POWER SWITCHING DEVICE WITH GALVANIC ISOLATION

(71) Applicant: United Technologies Corporation, Farmington, CT (US)

(72) Inventors: Joseph V Mantese, Ellington, CT (US); Vladimir Blasko, Avon, CT (US); Thomas Gietzold, Stratford-Upon-Avon (GB); Brian L McCabe, Orange, CT (US); Kurt J Sobanski, Glastonbury, CT (US)

(73) Assignee: United Technologies Corporation, Farmington, CT (US)

( * ) Notice: Subject to any disclaimer, the term of this patent is extended or adjusted under 35 U.S.C. 154(b) by 241 days.

(21) Appl. No.: 15/477,990

(22) Filed: Apr. 3, 2017

(65) Prior Publication Data

US 2018/0286612 A1 Oct. 4, 2018

(51) Int. Cl.
| | |
|---|---|
| *H01H 47/00* | (2006.01) |
| *H01P 3/16* | (2006.01) |
| *H03K 17/689* | (2006.01) |
| *H03K 17/785* | (2006.01) |
| *H02M 1/08* | (2006.01) |
| *H02M 7/49* | (2007.01) |

(Continued)

(52) U.S. Cl.
CPC ............ *H01H 47/007* (2013.01); *H01P 3/16* (2013.01); *H03K 17/689* (2013.01); *H03K 17/785* (2013.01); *H02M 1/08* (2013.01); *H02M 7/49* (2013.01); *H02M 7/493* (2013.01); *H02M 7/81* (2013.01)

(58) Field of Classification Search
CPC .......... H01H 47/007; H01P 3/16; H02M 1/08; H02M 7/493; H02M 7/49; H03K 17/689
See application file for complete search history.

(56) References Cited

U.S. PATENT DOCUMENTS

| | | | |
|---|---|---|---|
| 2013/0009491 A1* | 1/2013 | Hafner .................. | H02M 1/092 307/113 |
| 2014/0097886 A1* | 4/2014 | Shepard .................. | H02M 1/08 327/524 |

(Continued)

OTHER PUBLICATIONS

European Patent Office, European Search Report dated Jul. 30, 2018 in Application No. 18163913.9-1201.

(Continued)

*Primary Examiner* — Jared Fureman
*Assistant Examiner* — Duc M Pham
(74) *Attorney, Agent, or Firm* — Snell & Wilmer, L.L.P.

(57) ABSTRACT

A power electronics arrangement may comprise a power supply, a controller configured to receive a power from the power supply and generate an output signal, a waveguide, a receiver, filter, and converter (RFC) configured to receive the output signal via the waveguide, the RFC configured to generate a switching signal from the output signal, and a power switching device (PSD) configured to receive the switching signal from the RFC, wherein the controller transmits the output signal to the RFC through the waveguide via a transponder, the waveguide is coupled between the transponder and the RFC, and the PSD is galvanically isolated from the power supply.

15 Claims, 6 Drawing Sheets

(51) Int. Cl.
  *H02M 7/493* (2007.01)
  *H02M 7/81* (2006.01)

(56) References Cited

U.S. PATENT DOCUMENTS

2016/0226236 A1* 8/2016 Djelassi ............... H02J 7/0032
2016/0301249 A1* 10/2016 Hammerschmidt ...... H02J 1/06

OTHER PUBLICATIONS

Hideaki Fujita: "A Resonant Gate-Drive Circuit With Optically Isolated Control Signal and Power Supply for Fast-Switching and High-Voltage Power Semiconductor Devices", IEEE Transactions on Power Electronics, Institute of Electrical and Electronics Engineers, USA, vol. 28, No. 11, Nov. 1, 2013 (Nov. 1, 2013), pp. 5423-5430.

Shuichi Nagai et al: "A DC-isolated gate drive IC with drive-by-microwave technology for power switching levices", Solid-State Circuits Conference Digest of Technical Papers (ISSCC), 2012 IEEE International, IEEE, Feb. 19, 2012 (Feb. 19, 2012), pp. 404-406.

Nagai Shuichi et al: A Drive-by-Microwave isolated gate driver with a high-speed voltage monitoring, 2013 25th International Symposium on Power Semiconductor Devices & IC's (ISPSD), IEEE, Jun. 15, 2014 (Jun. 15, 2014), pp. 434-437.

* cited by examiner

SYSTEMS AND METHODS FOR SENDING A POWER SIGNAL TO A POWER SWITCHING DEVICE WITH GALVANIC ISOLATION

FIELD

The present disclosure relates to electronic power systems, and, more specifically, to systems and methods for controlling and powering electronic switching devices.

BACKGROUND

Power electronic devices formed from silicon, silicon carbide (SiC), and gallium nitride (GaN) semiconductors continue to evolve having ever increasing voltage and current switching capabilities. Such components have extensive use as motor drive converters from DC to DC and AC to DC; though the uses of these devices are many, impacting residential, commercial, aerospace, automotive, and many other product spaces not enumerated here.

The power electronics community often seeks to operate at the highest voltage and current level while minimizing size, weight and cost. As is axiomatic, electrical power is related to electrical current and voltage by the expression P=IV, where P=electrical power in Watts, I=electrical current in Amperes, and V=electrical potential in Volts. These power switches are usually triggered by logic integrated circuits coupled to power devices via a gate drive. This mode of operation is normally pursued so that the power (voltage and phase) to the load can be optimized for efficiency through the use of a central processing unit (CPU) or other computational device to continually adjust the "on" and "off" duty cycle. Time varied switching often occurs on the 1-10 ns times scales for SiC and GaN devices.

SUMMARY

A power electronics arrangement is disclosed herein, in accordance with various embodiments. The power electronics arrangement may comprise a power supply, a controller configured to receive a power from the power supply and generate an output signal, a waveguide, a receiver, filter, and converter (RFC) configured to receive the output signal via the waveguide, the RFC configured to generate a switching signal from the output signal, and a power switching device (PSD) configured to receive the switching signal from the RFC, wherein the controller transmits the output signal to the RFC through the waveguide via a transponder, the waveguide is coupled between the transponder and the RFC, and the PSD is galvanically isolated from the power supply.

In various embodiments, the RFC may be configured to further generate a power signal from the output signal, the PSD configured to receive the power signal from the RFC. The PSD may comprise a transistor having a gate, and at least one of a low-side switch or a high-side switch. The waveguide may be configured to guide at least one of an optical signal and a radio frequency signal. The PSD may receive power solely via the power signal from the power supply. The waveguide may comprise at least one of an optical waveguide and a radio frequency signal (RF) waveguide.

A power electronics arrangement is disclosed herein, in accordance with various embodiments. The power electronics arrangement may comprise a control stage comprising a power supply and a controller, a switching stage comprising a receiver, filter, and converter (RFC) and a power switching device (PSD), and a waveguide, wherein an output signal is sent from the control stage to the switching stage via the waveguide, wherein the switching stage is galvanically isolated from the control stage.

In various embodiments, the RFC may be configured to receive the output signal from the waveguide and convert the output signal into a switching signal and a power signal, the PSD is powered by the power signal and the PSD is controlled by the switching signal. The PSD may comprise a transistor having a gate, wherein the gate is controlled via the switching signal. The PSD may comprise at least one of a low-side switch or a high-side switch. The waveguide may comprise at least one of an optical waveguide and a radio frequency signal (RF) waveguide. The power supply may supply the power signal to the switching stage via the output signal. The PSD may be galvanically isolated from the controller. The output signal may comprise at least one of an optical signal and a radio frequency (RF) signal.

A method for operating a PSD is disclosed herein, in accordance with various embodiments. The method may comprise supplying, by a power supply, a power to a controller, converting, by the controller, the power into an output signal, guiding, by a waveguide, the output signal, receiving, by a receiver, filter, converter (RFC), the output signal, wherein the RFC is galvanically isolated from the controller, and powering, by the output signal, the PSD.

In various embodiments, the method may further comprise converting, by the RFC, the output signal into a power signal and a switching signal, and receiving, by a gate of the PSD, the switching signal. The method may further comprise converting, by the controller, the power into an optical signal. The method may further comprise converting, by the controller, the power into a radio frequency (RF) signal. The method may further comprise receiving, by a photo receiver and power converter (PRPC), the optical signal, wherein the PRPC comprises a photo detector and voltage source. The method may further comprise receiving, by an antenna, the RF signal, wherein the RFC comprises the antenna.

The forgoing features and elements may be combined in various combinations without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the figures, wherein like numerals denote like elements.

DETAILED DESCRIPTION

The detailed description of exemplary embodiments herein makes reference to the accompanying drawings, which show exemplary embodiments by way of illustration. While these exemplary embodiments are described in sufficient detail to enable those skilled in the art to practice the inventions, it should be understood that other embodiments may be realized and that logical changes and adaptations in design and construction may be made in accordance with this invention and the teachings herein. Thus, the detailed description herein is presented for purposes of illustration only and not of limitation. The scope of the invention is defined by the appended claims. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact. Surface shading lines may be used throughout the figures to denote different parts but not necessarily to denote the same or different materials. In some cases, reference coordinates may be specific to each figure.

Logic devices typically operate in the 0-5V range with bits being designated as a "1" or a "0" with reference to a low voltage potential. However, more recent power electronics devices can operate above 1 kV and switch currents greater than 10 A. Consequently, voltage level shifting is utilized and current, voltage, and (electromagnetic interference) EMI transients can arise, causing false signals to the gate drive and hence unwanted activation of the power device. It is thus desirable to galvanically isolate the logic circuitry from the gate drive, which is often achieved by using an optical isolator. However, the gate drive remains galvanically coupled to the device being controlled and thus utilizes a separate power supply. Moreover, the gate drive circuitry represents considerable size, weight, and power when fully packaged. Hence it is desirable to find a means to both galvanically isolate the logic devices and trigger the power electronics switching devices without adding power supplies and discrete logic circuitry.

The present disclosure provides a system design based upon the use of radio frequency (RF) and/or optical electromagnetic energy to transmit the logic level and the power required to drive a power electronic switching device. Power electronics arrangements, as described herein, may reduce total part count, weight, and size by eliminating a separate gate drive unit and gate drive power supply for the switching device. Power electronics arrangements, as described herein, may be immune or resistant to EMI/RFI interference.

In various embodiments, the power for the power devices, as described herein, may be provided by either a device power supply in electronic communication with the power devices or a power supply in the control stage. The device power supply may be used for high voltage applications such as motor control or lower voltage applications such as single sided solenoid control using low-side switches. Alternately, the power supply in the control stage may supply power to the power device through the waveguide, receiver, filter, and converter (RFC) and PSD. This alternate configuration may be be used in lower voltage applications such as dual wire solenoid control or direct drive hydraulic or electro-hydraulic servo valves for controlling devices without individual wires.

Power electronics arrangements, as described herein, may comprise a control stage galvanically isolated from a switching stage. Said galvanic isolation may protect the low level switching signal of the switching stage from "noise" of the control stage signals, which may potentially inadvertently trigger the PSD of the switching stage.

Figure 1A:
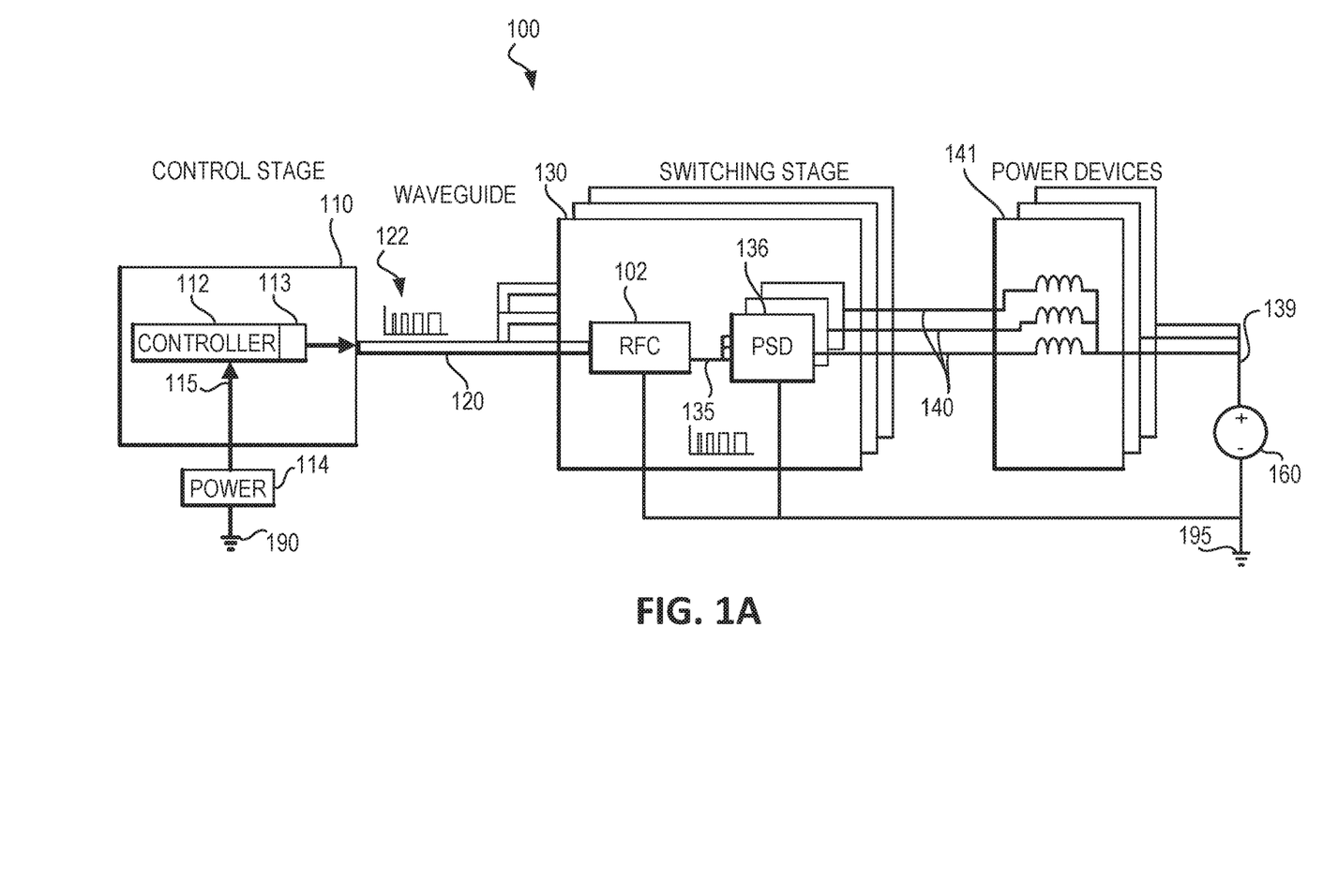
FIG. 1A illustrates a schematic view of a power electronics arrangement with a control stage in electronic communication with a switching stage via a waveguide, in which power to the power devices is supplied by a device power supply, in accordance with various embodiments.

With reference to FIG. 1A, a power electronics arrangement 100 is illustrated, in accordance with various embodiments. Power electronics arrangement 100 may comprise a control stage 110, a waveguide 120, and a plurality of switching stages 130. Power electronics arrangement 100 may be used to control a set of power devices 141 supplied with current from a power supply 160.

In various embodiments, control stage 110 may comprise a controller 112. Power supply 114 may supply a power 115 to controller 112. Power supply 114 may supply power 115 to controller 112 with grounding to 190. Controller 112 may comprise any suitable control logic or power electronics elements suitable for controlling power signals. In various embodiments, controller 112 may comprise a central processing unit (CPU), processor, microprocessor, or the like. In various embodiments, controller 112 may comprise control logic for tailoring a waveform, such as a pulse width modulated waveform for example, for a particular application. Controller 112 may comprise a power transponder 113.

In various embodiments, power transponder 113 may send an output signal 122 to switching stage 130 via waveguide 120. Output signal 122 may comprise a pulse width modulated signal. Waveguide 120 may be immune to electromagnetic interference. Waveguide 120 may be immune to radio frequency interference. Waveguide 120 may comprise a dielectric material.

Figure 2A:
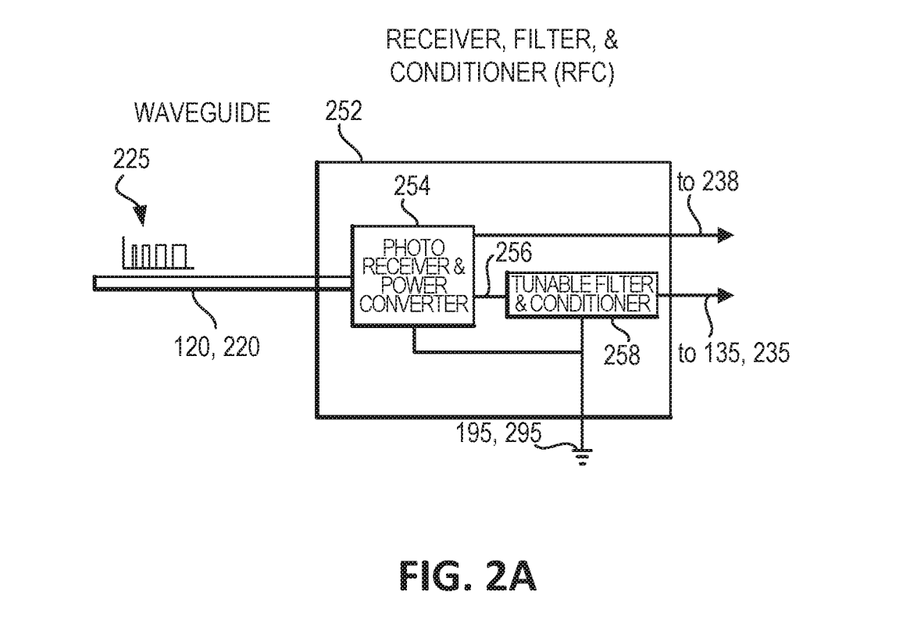
FIG. 2A illustrates a schematic view of a receiver, filter, and conditioner (RFC) for receiving an optical signal, in accordance with various embodiments.

In various embodiments, output signal 122 may comprise an optical signal 225, with momentary reference to FIG. 2A. Optical signal 225 may comprise an ultra violet (UV) signal, a short wave infrared (SWIR) signal, a longwave infrared (LWIR) signal, visible light, or any other suitable signal for optical communications using a laser diode or similar device. In this regard, waveguide 120 may comprise an optical cable or guide.

Figure 2B:
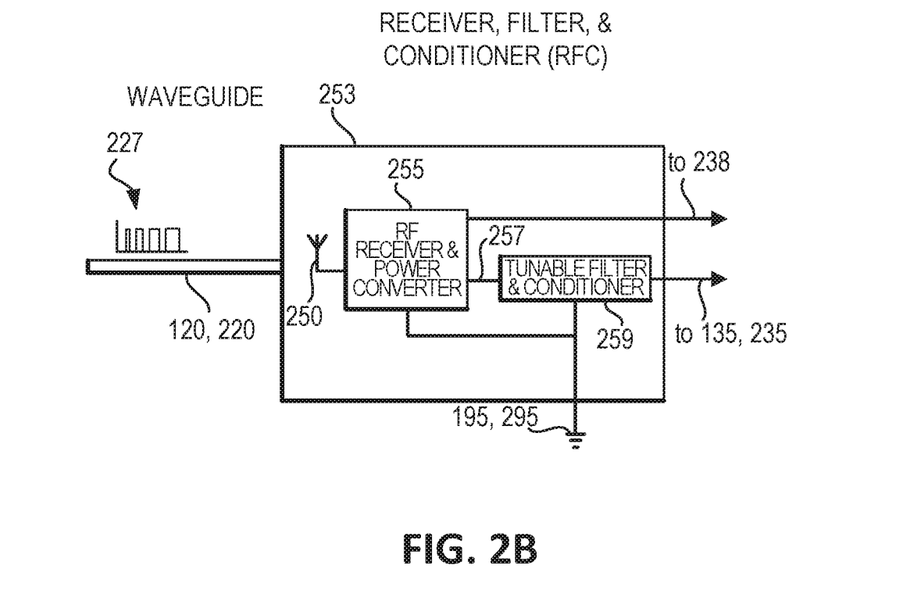
FIG. 2B illustrates a schematic view of an RFC for receiving a radio frequency (RF) signal, in accordance with various embodiments.

In various embodiments, output signal 122 may comprise a radio frequency (RF) signal 227, with momentary reference to FIG. 2B. RF signal 227 may contain RF waveforms. In this regard, waveguide 120 may comprise an RF waveguide.

In various embodiments, switching stage 130 may be triggered in response to output signal 122. Switching stage 130 may comprise a receiver, filter, converter (RFC) 102 and a plurality of power switching devices (PSD) 136. A plurality of power devices 141 may be in electronic communication with PSDs 136. In various embodiments, plurality of power devices 141 may comprise motors.

With reference to FIG. 1A, power devices 141 may be supplied with current from power supply 160. In this regard, PSD 136 may receive output signal 122 for the control of PSD 136. In this regard, RFC 102 may receive, filter, and/or condition output signal 122 and send a switching signal 135 to PSD 136 which may control the power received by power devices 141 from power supply 160. The PSD utilizes the switching signal 135 to switch power to the power devices 141 by switching of the driver lines 140 to each power device 141.

In various embodiments, the power supplied to the power devices 141 may be sourced from power supply 160 at a "high side" DC power rail 139 with device grounding provided by switching PSD 136 to ground 195. In this manner, ground 190 is galvanically isolated from ground 195. Said galvanic isolation may provide protection from high current switching transients from impacting the low level switching signal 135 from noisy or erratic switching of output signal 122.

Figure 1B:
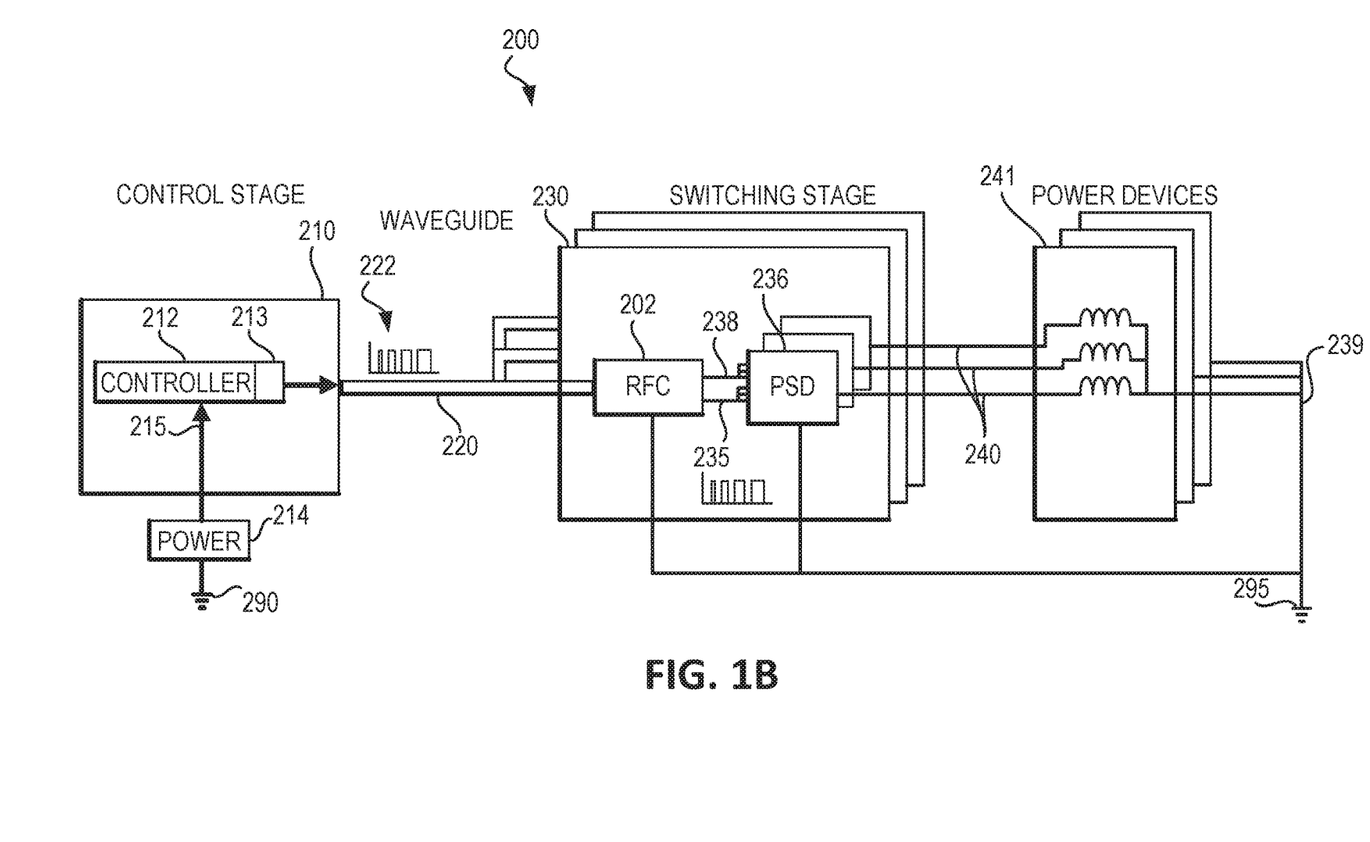
FIG. 1B illustrates a schematic view of a power electronics arrangement with a control stage in electronic communication with a switching stage via a waveguide, in which power is delivered to the power devices from the power supply in the control stage through the waveguide and switching stage, in accordance with various embodiments.

With reference to FIG. 1B, a power electronics arrangement 200 is illustrated, in accordance with various embodiments. Power electronics arrangement 200 may comprise a control stage 210, a waveguide 220, and a plurality of switching stages 230. Power electronics arrangement 200 may be used to control a set of power devices 241 supplied with current from power supply 214 in the control stage 210.

In various embodiments, control stage 210 may comprise a controller 212. Power supply 214 may supply a power 215 to controller 212. Power supply 214 may supply power 215 to controller 212 with grounding to 290. Controller 212 may comprise any suitable control logic or power electronics elements suitable for controlling power signals. In various embodiments, controller 212 may comprise a CPU, processor, microprocessor, or the like. In various embodiments, controller 212 may comprise control logic for tailoring a waveform, such as a pulse width modulated waveform for example, for a particular application. Controller 212 may comprise a power transponder 213.

In various embodiments, power transponder 213 may send an output signal 222 to switching stage 230 via waveguide 220. Output signal 222 may comprise a pulse width modulated signal. Waveguide 220 may be immune to electromagnetic interference. Waveguide 220 may be immune to radio frequency interference. Waveguide 220 may comprise a dielectric material.

In various embodiments, output signal 222 may comprise an optical signal 225, with momentary reference to FIG. 2A. Optical signal 225 may comprise a UV signal, a SWIR signal, a LWIR signal, visible light, or any other suitable signal for optical communications using a laser diode or similar device. In this regard, waveguide 220 may comprise an optical waveguide such as an optical cable, for example.

In various embodiments, output signal 222 may comprise an RF signal 227, with momentary reference to FIG. 2B. RF signal 227 may contain RF waveforms. In this regard, waveguide 220 may comprise an RF waveguide such as a rectangular waveguide or a circular waveguide, for example.

In various embodiments, switching stage 230 may be triggered in response to output signal 222. Switching stage 230 may comprise an RFC 202 and a plurality of PSDs 236. A plurality of power devices 241 may be in electronic communication with PSDs 236. In various embodiments, plurality of power devices 241 may comprise devices such as solenoids, electro-hydraulic servo valves or similar devices.

With reference to FIG. 1B, power devices 241 may be supplied with current from power supply 214. In this regard, RFC 202 may receive output signal 222 for the control of PSD 236 as well as for the supply of power to PSD 236. In this regard, RFC 202 may receive, filter, and/or condition output signal 222 and send a switching signal 235 and a power signal 238 to PSD 236. The PSD utilizes the switching signal 235 to switch power to the power devices 241 by switching of the driver lines 240 to each power device 241. The PSD utilizes the power signal 238 for supplying power to power devices 241. In this regard, PSD 236 may be powered solely via power 215 from power supply 214.

In various embodiments, the power supplied to the power devices 241 may be sourced from RFC 202, switched by PSD 236 to driver lines 240 via a "high side" switch with grounding at 295. In this manner, ground 290 is galvanically isolated from ground 295. Said galvanic isolation may provide protection from high current switching transients, single winding shorts to ground and from impacting the low level switching signal 235 from noisy or erratic switching of output signal 222. Stated differently, RFC 202 may receive optical and/or RF power and signal through waveguide 220 and may provide a DC power signal 238 and switching signal 235 to the PSDs 236.

With reference to FIG. 2A, an RFC 252 for receiving an optical signal 225 is illustrated, in accordance with various embodiments. In various embodiments, RFC 202 (see FIG. 1B) may be similar to RFC 252. RFC 252 may comprise a photo receiver and power converter (PRPC) 254 for receiving and converting optical signal 225 from waveguide 220. In various embodiments, PRPC 254 may comprise a photo detector and voltage source. PRPC 254 may convert optical signal 225 into a power signal 238 suitable for powering one or more PSDs (e.g., PSDs 236 of FIG. 1B) of the same RFC. RFC 252 may comprise a tunable filter and conditioner (TFC) 258. PRPC 254 may provide switching signals via TFC 258 for controlling switching of multiple PSDs (e.g., PSDs 236 of FIG. 1B). Stated differently, the TFC 258 may be utilized to derive several switching signals from a single switching signal 256.

With reference to FIG. 2B, an RFC 253 for receiving an RF signal 227 is illustrated, in accordance with various embodiments. In various embodiments, RFC 202 (see FIG. 1B) may be similar to RFC 253. RFC 253 may comprise an RF receiver and power converter (RFRPC) 255 for receiving and converting RF signal 227 from waveguide 220. RFC 253 may comprise an antenna 250 in electronic communication with RFRPC 255. RFRPC 255 may convert RF signal 227 into a power signal 238 suitable for powering one or more PSDs (e.g., PSDs 236 of FIG. 1B) of the same RFC. RFC 253 may comprise a tunable filter and conditioner (TFC) 259. RFRPC 255 may provide switching signals via TFC 259 for controlling switching of multiple PSDs (e.g., PSDs 236 of FIG. 1B). Stated differently, the TFC 259 may be utilized to derive several switching signals from a single switching signal 257.

Figure 3A:
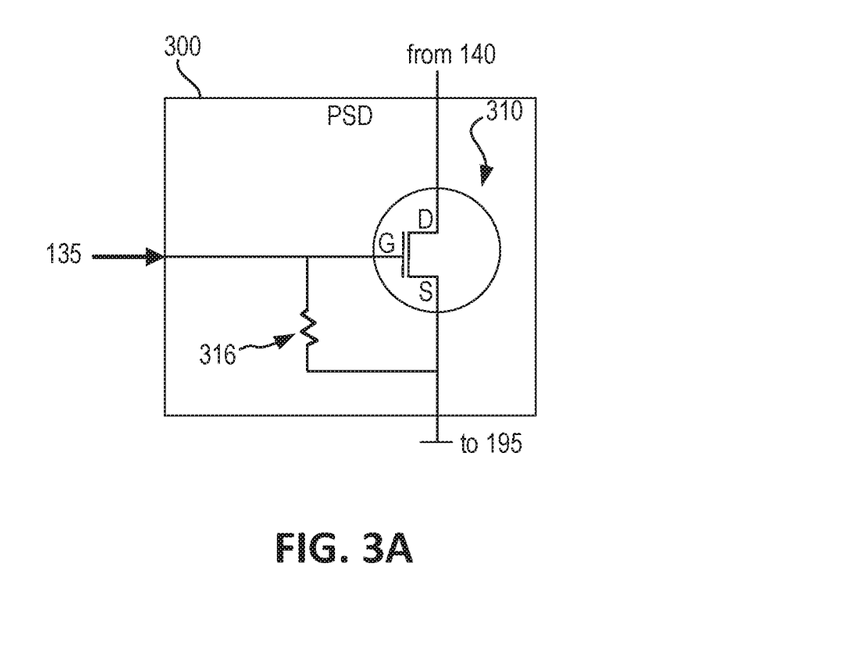
FIG. 3A illustrates a power switching device (PSD) having a transistor for low-side switching, in accordance with various embodiments.

With reference to FIG. 3A, an exemplary PSD 300 is illustrated as a low-side switch wherein power from the power devices 141 (see FIG. 1A) is switched to ground 195, in accordance with various embodiments. With momentary reference to FIG. 1A, PSD 136 may be configured as PSD 300, as described herein. PSD 300 may be configured to receive the switching signal 135. PSD 300 may comprise a transistor 310 comprising a gate G, a drain D, and a source S. Gate G may receive the switching signal 135. The gate G may be controlled via the switching signal 135. A resistor 316 may be coupled between gate G and a ground or neutral. Resistor 316 may drain a charge on gate G.

Figure 3B:
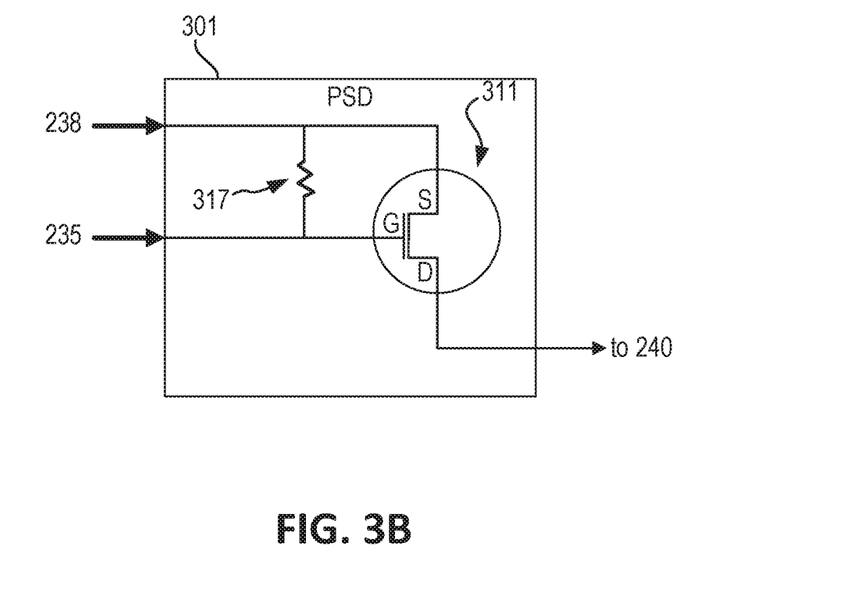
FIG. 3B illustrates a PSD having a transistor for high-side switching, in accordance with various embodiments.

With reference to FIG. 3B, an exemplary PSD 301 is illustrated as a high-side switch wherein power signal 238 is switched to power devices 241 through driver lines 240, in accordance with various embodiments. With momentary reference to FIG. 1B, PSD 236 may be configured as PSD 301, as described herein. PSD 301 may be configured to receive switching signal 235. PSD 301 may be configured to receive power signal 238. PSD 301 may comprise a transistor 311 comprising a gate G, a drain D, and a source S. Gate G may receive switching signal 235. The gate G may be controlled via switching signal 235. A resistor 317 may be coupled between gate G and source S. Resistor 317 may pull up the voltage on gate G to turn off transistor 311.

Figure 4:
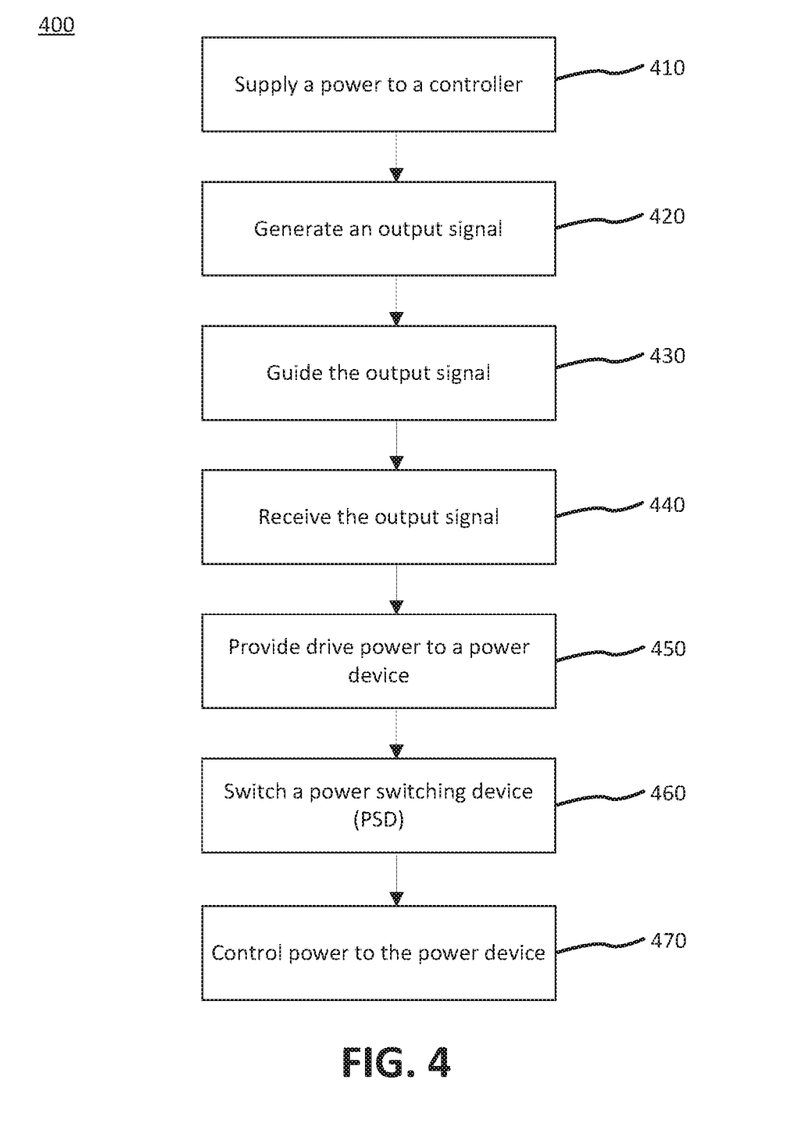
FIGS. 4 and 5 illustrate a method for operating a power electronics switching device, in accordance with various embodiments.

With reference to FIG. 4, a method 400 for operating a power electronics switching device is illustrated, in accordance with various embodiments. Method 400 includes supplying a power to a controller (step 410). Method 400 includes generating an output signal (step 420). Method 400 includes guiding the output signal (step 430). Method 400 includes receiving the output signal (step 440). Method 400 includes providing drive power to a power device (step 450). Method 400 includes switching a PSD (step 460). Method 400 includes controlling power to the power device (step 470).

Figure 5:
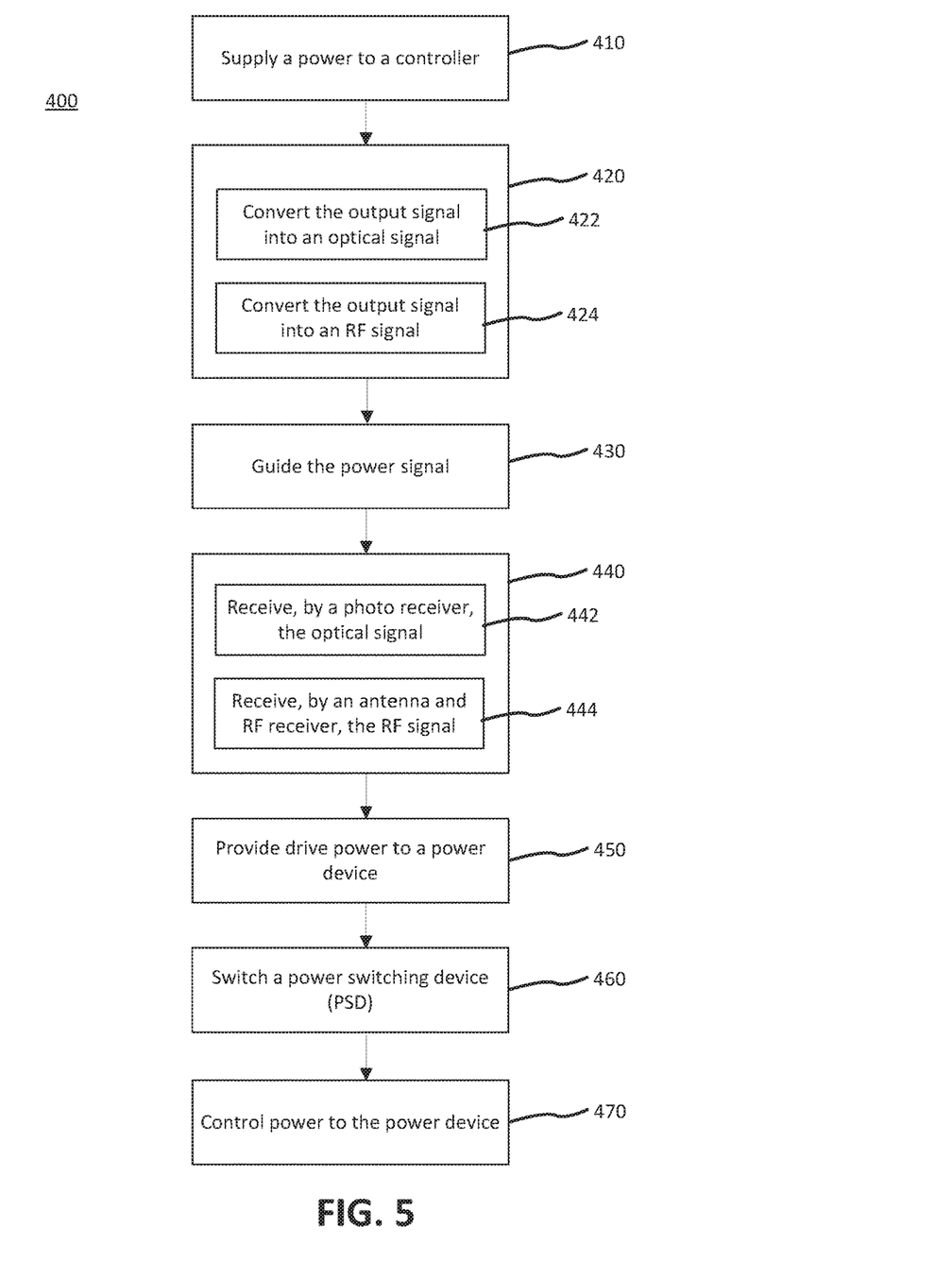

With reference to FIG. 5, method 400 may comprise various sub-steps. Step 420 may include converting the output signal into an optical signal (sub-step 422). Step 420 may include converting the output signal into an RF signal (sub-step 424). Step 440 may include receiving, by a photo receiver, the optical signal (sub-step 442). Step 440 may include receiving, by an antenna and RF receiver, the RF signal (sub-step 444).

With combined reference to FIG. 1A, FIG. 1B, FIG. 2A, FIG. 2B and FIG. 4, step 410 may include supplying, by power supply 114, power 115 to controller 112. Step 410 may include supplying, by power supply 214, power 215 to controller 212. Step 420 may include converting, by controller 112, power 115 into optical signal 225 (sub-step 422). Step 420 may include converting, by controller 212, power 215 into optical signal 225 (sub-step 422). Step 420 may include converting, by controller 112, power 115 into RF signal 227 (sub-step 424). Step 420 may include converting, by controller 212, power 215 into RF signal 227 (sub-step 424). Step 430 may include guiding, by waveguide 120, optical signal 225. Step 430 may include guiding, by waveguide 120, RF signal 227. Step 430 may include guiding, by waveguide 220, optical signal 225. Step 430 may include guiding, by waveguide 220, RF signal 227. Step 440 may include receiving, by RFC 102, output signal 122. Step 440 may include receiving, by RFC 202, output signal 222. Step 440 may include receiving, by RFC 252, optical signal 225 (sub-step 442). Step 440 may include receiving, by RFC 253, RF signal 227 (sub-step 444). Step 450 may include providing, by PSD 236, power signal 238 from output signal 222 to power devices 241. Step 450 may include providing, by power supply 160, power signal 139 to power devices 141. Step 460 may include switching PSD 136, via switching signal 135. Step 460 may include switching PSD 236 via switching signal 235. Step 470 may include controlling, by switching signal 235, PSD 236. For example, with momentary reference to FIG. 3B, switching signal 235 may control when gate G of PSD 300 is opened and/or closed. Step 470 may include controlling, by switching signal 135, PSD 136. For example, with momentary reference to FIG. 3A, switching signal 135 may control when gate G of PSD 300 is opened and/or closed.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C.

Systems, methods and apparatus are provided herein. In the detailed description herein, references to "various embodiments", "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is intended to invoke 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A power electronics arrangement, comprising:
    a power supply;
    a controller configured to receive a power from the power supply and generate an output signal;
    a waveguide;
    a receiver, filter, and converter (RFC) configured to receive the output signal via the waveguide, the RFC configured to generate a switching signal from the output signal, and the RFC configured to generate a power signal from the output signal; and
    a power switching device (PSD) configured to receive the switching signal and the power signal from the RFC, the PSD comprises a transistor having a gate, and at least one of a low-side switch or a high-side switch;

wherein the controller transmits the output signal to the RFC through the waveguide via a transponder, the waveguide is coupled between the transponder and the RFC, and the PSD is galvanically isolated from the power supply.

2. The power electronics arrangement of claim 1, wherein the waveguide is configured to guide at least one of an optical signal and a radio frequency signal.

3. The power electronics arrangement of claim 1, wherein the PSD receives power solely via the power signal from the power supply.

4. The power electronics arrangement of claim 1, wherein the waveguide comprises at least one of an optical waveguide and a radio frequency signal (RF) waveguide.

5. The power electronics arrangement of claim 1, wherein the waveguide is an optical waveguide comprising a dielectric material.

6. A power electronics arrangement, comprising:
  a control stage, comprising:
    a power supply; and
    a controller;
  a switching stage, comprising:
    a receiver, filter, and converter (RFC); and
    a power switching device (PSD); and
  a waveguide;
  wherein an output signal is sent from the control stage to the switching stage via the waveguide, the RFC is configured to receive the output signal from the waveguide and convert the output signal into a switching signal and a power signal, the PSD is powered by the power signal and the PSD is controlled by the switching signal;
  the PSD comprises a transistor having a gate, and at least one of a low-side switch or a high-side switch, wherein the gate is controlled via the switching signal; and
  wherein the switching stage is galvanically isolated from the control stage.

7. The power electronics arrangement of claim 6, wherein the waveguide comprises at least one of an optical waveguide and a radio frequency signal (RF) waveguide.

8. The power electronics arrangement of claim 6, wherein the power supply supplies the power signal to the switching stage via the output signal.

9. The power electronics arrangement of claim 6, wherein the PSD is galvanically isolated from the controller.

10. The power electronics arrangement of claim 6, wherein the output signal comprises at least one of an optical signal and a radio frequency (RF) signal.

11. A method for operating a power switching device (PSD), comprising:
  supplying, by a power supply, a power to a controller;
  converting, by the controller, the power into an output signal;
  guiding, by a waveguide, the output signal;
  receiving, by a receiver, filter, converter (RFC), the output signal, wherein the RFC is galvanically isolated from the controller;
  converting, by the RFC, the output signal into a power signal and a switching signal; and
  receiving, by a gate of the PSD, the switching signal; and
  powering, by the output signal, the PSD;
  wherein the PSD comprises a transistor having the gate, and at least one of a low-side switch or a high-side switch, wherein the gate is controlled via the switching signal.

12. The method of claim 11, further comprising:
converting, by the controller, the power into an optical signal.

13. The method of claim 11, further comprising:
converting, by the controller, the power into a radio frequency (RF) signal.

14. The method of claim 12, further comprising:
receiving, by a photo receiver and power converter (PRPC), the optical signal;
wherein the PRPC comprises a photo detector and voltage source.

15. The method of claim 13, further comprising:
receiving, by an antenna, the RF signal;
wherein the RFC comprises the antenna.

* * * * *